United States Patent
Ito et al.

(10) Patent No.: US 9,761,711 B2
(45) Date of Patent: Sep. 12, 2017

(54) SEMICONDUCTOR DEVICE

(71) Applicant: KABUSHIKI KAISHA TOSHIBA, Tokyo (JP)

(72) Inventors: Kankichi Ito, Hanamaki Iwate (JP); Hideki Okumura, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/060,526

(22) Filed: Mar. 3, 2016

(65) Prior Publication Data

US 2017/0077298 A1     Mar. 16, 2017

(30) Foreign Application Priority Data

Sep. 10, 2015    (JP) ................ 2015-178459

(51) Int. Cl.

| | |
|---|---|
| *H01L 21/3105* | (2006.01) |
| *H01L 29/78* | (2006.01) |
| *H01L 29/06* | (2006.01) |
| *H01L 29/423* | (2006.01) |
| *H01L 29/45* | (2006.01) |
| *H01L 29/49* | (2006.01) |
| *H01L 29/66* | (2006.01) |

(52) U.S. Cl.
CPC ...... *H01L 29/7827* (2013.01); *H01L 29/0634* (2013.01); *H01L 29/0684* (2013.01); *H01L 29/0692* (2013.01); *H01L 29/4236* (2013.01); *H01L 29/456* (2013.01); *H01L 29/4916* (2013.01); *H01L 29/66666* (2013.01)

(58) Field of Classification Search
CPC ............ H01L 29/0634; H01L 29/0653; H01L 29/7802–29/7815; H01L 29/7827; H01L 29/7828; H01L 29/78642
See application file for complete search history.

(56) References Cited

U.S. PATENT DOCUMENTS

| | | | |
|---|---|---|---|
| 5,216,275 A * | 6/1993 | Chen ................... | H01L 29/0634 257/266 |
| 7,994,570 B2 | 8/2011 | Tamura | |
| 2002/0063259 A1* | 5/2002 | Usui ................... | H01L 29/0634 257/110 |
| 2014/0042523 A1 | 2/2014 | Yamagami et al. | |
| 2014/0327070 A1* | 11/2014 | Hirler ................... | H01L 29/063 257/329 |
| 2015/0076589 A1* | 3/2015 | Sato .................... | H01L 29/7802 257/329 |

* cited by examiner

*Primary Examiner* — Daniel Shook

(74) *Attorney, Agent, or Firm* — Patterson & Sheridan, LLP

(57) ABSTRACT

A semiconductor device includes a first electrode, a second electrode, a first semiconductor region of a first conductivity type that is between the first electrode and the second electrode. A second semiconductor region is adjacent to the first semiconductor region along a first direction and includes a second conductivity type material. A first insulating region is provided within the second semiconductor region. A third electrode is provided on the first semiconductor region via a second insulating region.

14 Claims, 9 Drawing Sheets

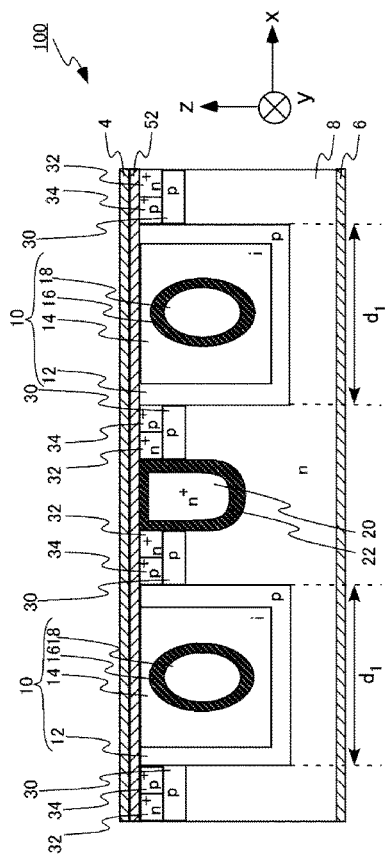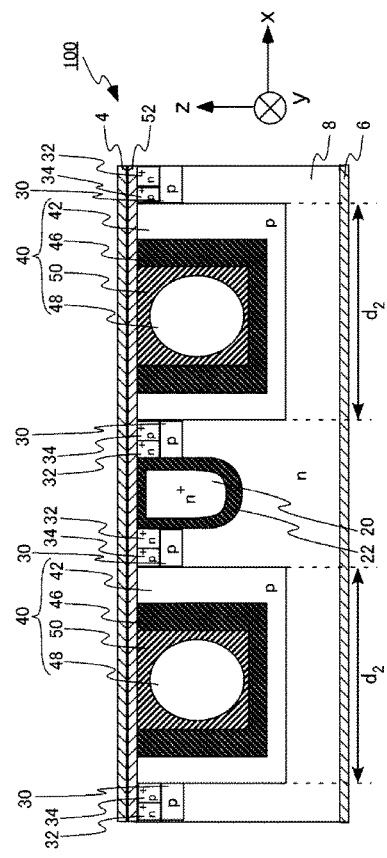

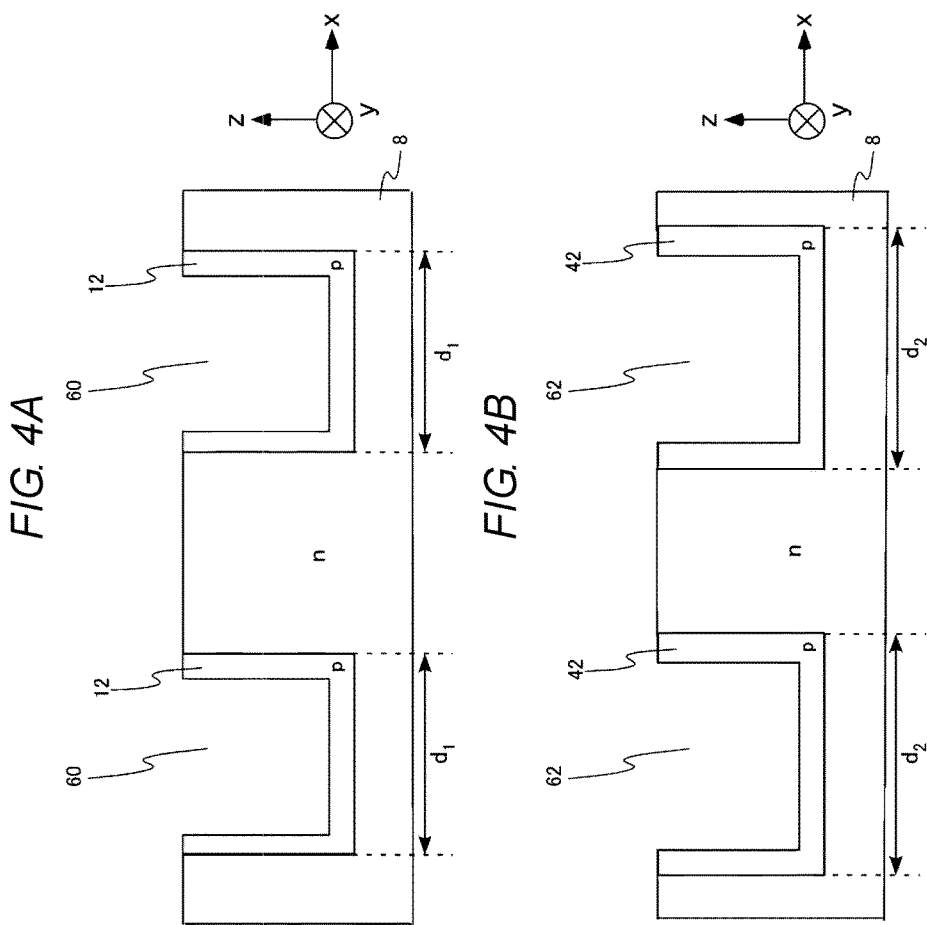

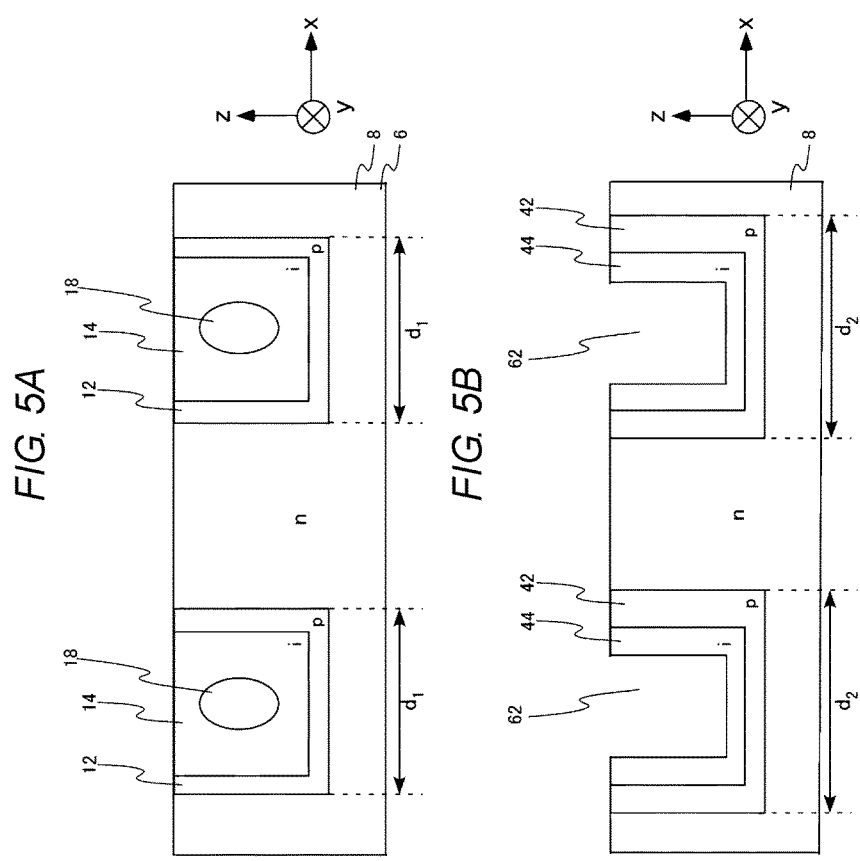

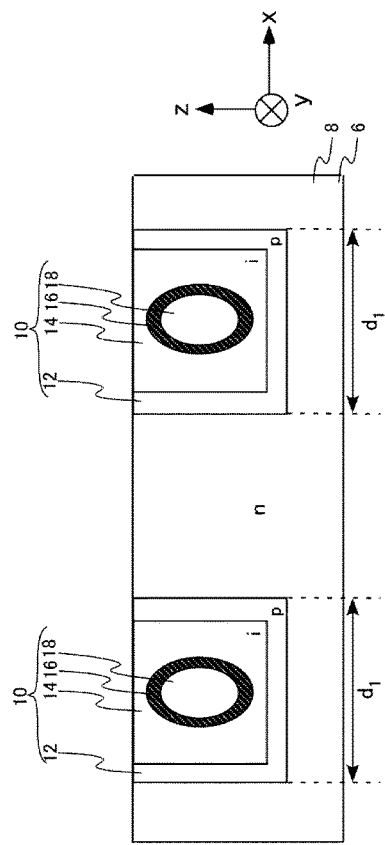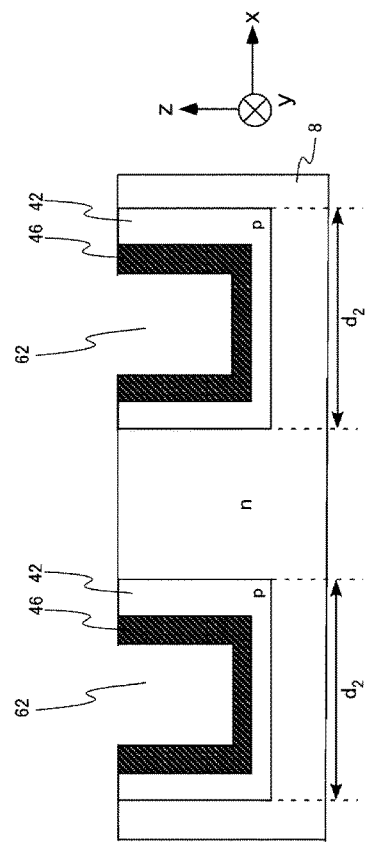

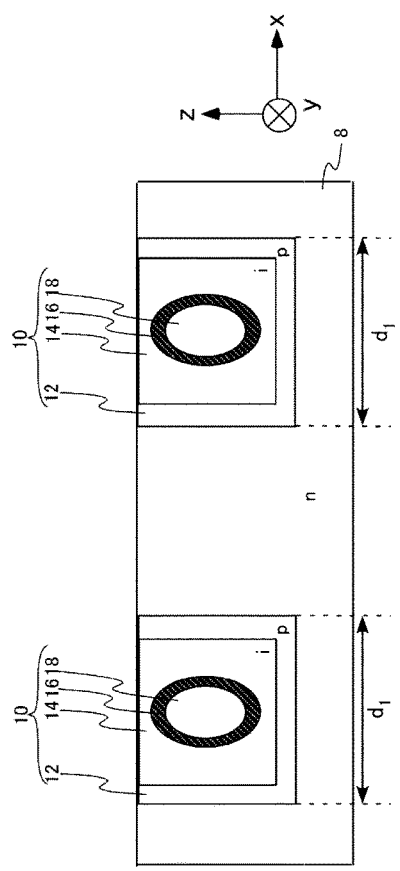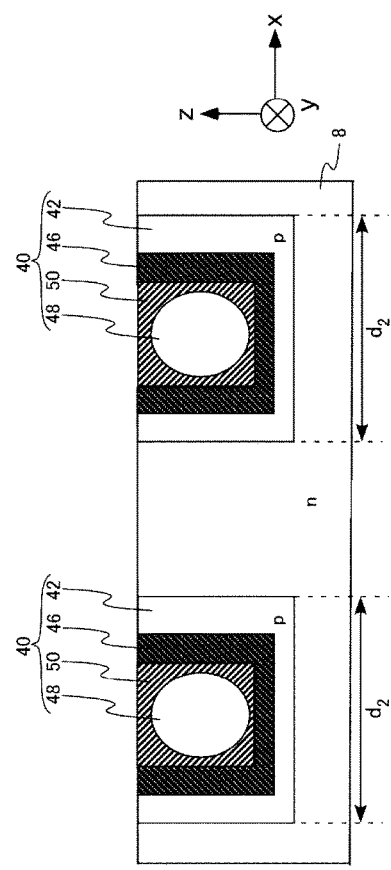

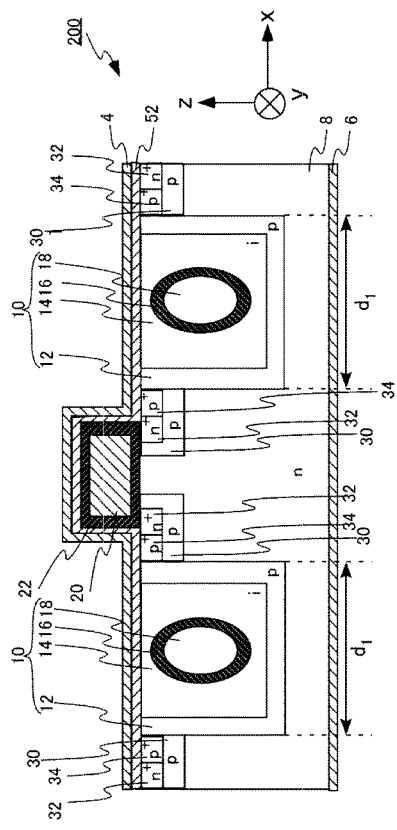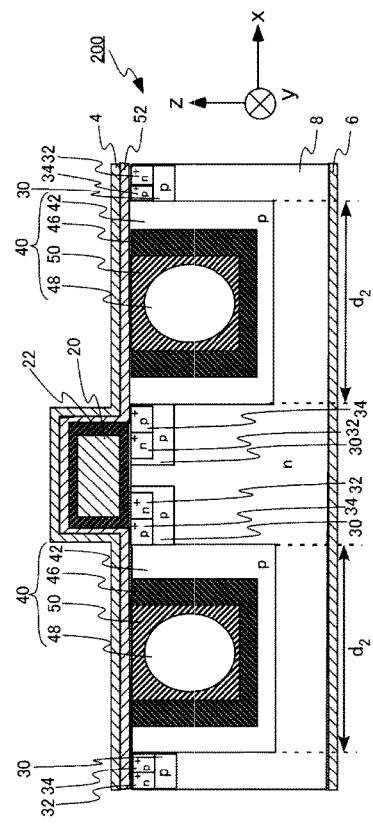

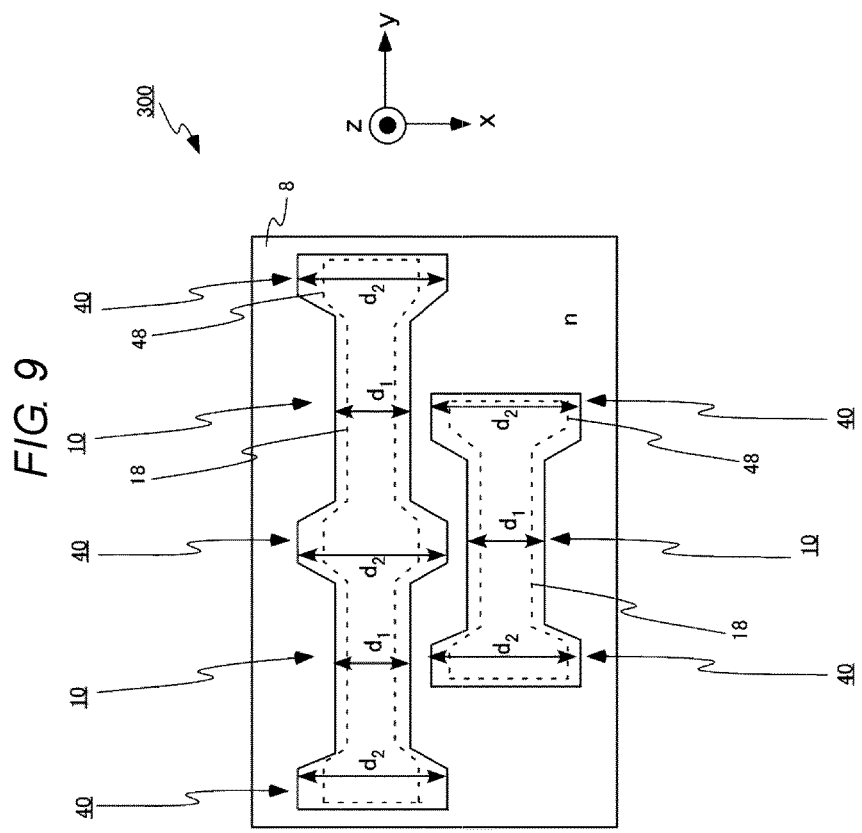

SEMICONDUCTOR DEVICE

CROSS-REFERENCE TO RELATED APPLICATION

This application is based upon and claims the benefit of priority from Japanese Patent Application No. 2015-178459, filed on Sep. 10, 2015, the entire contents of which are incorporated herein by reference.

FIELD

Embodiments described herein relate generally to a semiconductor device.

BACKGROUND

There is a vertical metal oxide semiconductor field effect transistor (MOSFET) in which a p type (or n type) semiconductor layer is embedded in an n type (or p type) semiconductor layer. The vertical MOSFET can have a super junction structure (a "SJ structure") in which n type and p type regions are alternately arranged. In a semiconductor device for power control such an arrangement provides a high breakdown voltage and a low ON resistance. In the SJ structure, the amount of n type impurities included in the n type region is equal to the amount of p type impurities included in the p type region, this arrangement of balanced n and p type impurities, in effect, simulates or behaves in relevant aspect as a non-doped region and a high breakdown voltage is thus achieved. At the same time, current in the device can flow through a region having high impurity concentration, and thus it is still possible to achieve a low ON resistance.

As a method for forming the SJ structure, for example, there is a method of forming trenches in an n type semiconductor layer and filling the trenches with a p type semiconductor material. However, in this method, a hollow portion (empty hole, void) may easily be formed inside a p type semiconductor material.

DESCRIPTION OF THE DRAWINGS

FIGS. 1A and 1B are schematic cross-sectional views of a semiconductor device according to a first embodiment.

FIGS. 3A and 3B to FIGS. 7A and 7B are schematic cross-sectional views of the semiconductor device during the process of manufacturing the semiconductor device according to the first embodiment according to a manufacturing method.

FIGS. 4A and 4B are schematic cross-sectional views of the semiconductor device during the process of manufacturing.

FIGS. 5A and 5B to FIGS. 7A and 7B are schematic cross-sectional views of the semiconductor device during the process of manufacturing.

FIGS. 8A and 8B are schematic cross-sectional views of a semiconductor device according to a second embodiment.

FIG. 9 is a schematic top view illustrating aspects of a semiconductor device according to a third embodiment.

DETAILED DESCRIPTION

Figure 2:
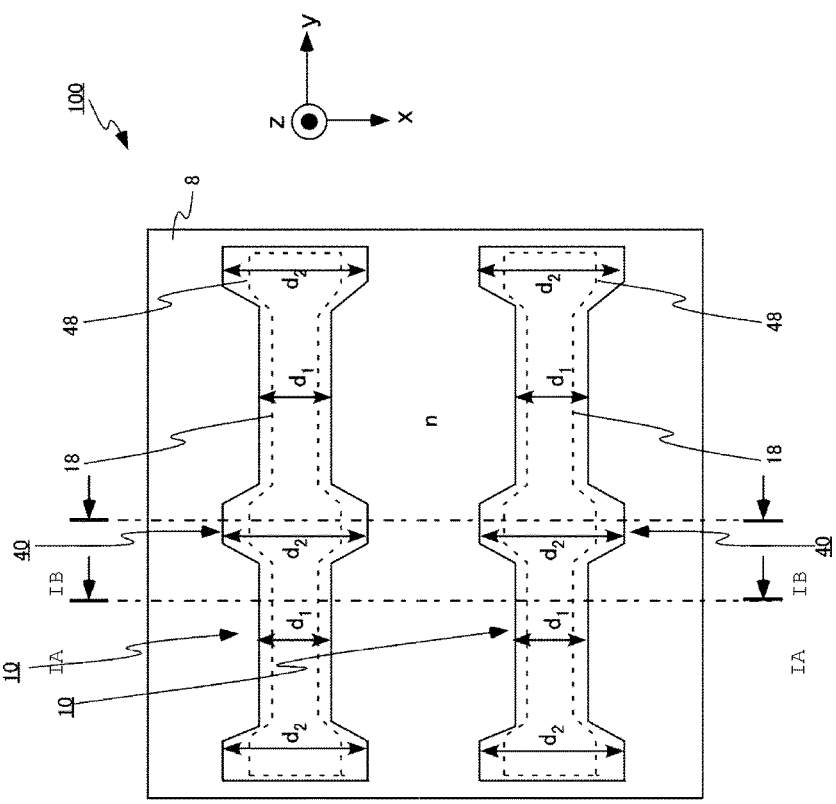
FIG. 2 is a schematic top view illustrating aspects of the semiconductor device according to the first embodiment.

Embodiments provide a semiconductor device having stable super junction characteristics.

In general, according to one embodiment, a semiconductor device includes a first semiconductor region of a first conductivity type that is provided between a first electrode and a second electrode. A second semiconductor region including a second conductivity type material is provided adjacent to the first semiconductor region in a first direction. A first insulating region is provided within the second semiconductor region. A third electrode is provided on the first semiconductor region via a second insulating region.

Embodiments will be hereinafter descried with reference to the drawings. In the following description, the same symbols or reference numerals will be attached to the same elements or the like in different drawings, and description of the elements or the like described once will be omitted from subsequent descriptions when appropriate.

In the disclosure, an upward direction of the drawing is referred to as "upper", and a downward direction of the drawing is referred to as "lower", in order to represent a positional relationship of components or the like. In the disclosure, the concept of "upper" and "lower" is thus positional and does not necessarily correspond to terms representing directional relationships with respect to a direction of gravity.

(First Embodiment)

A semiconductor device according to the first embodiment includes a first electrode; a second electrode; a first semiconductor region of a first conductivity type which is provided between the first electrode and the second electrode; a second semiconductor region alternating with the first semiconductor region in a first direction and includes a second conductivity type impurity; a first insulating region which is provided inside the second semiconductor region; a third electrode which is provided on the first semiconductor region; and a second insulating region which is provided around the third electrode.

FIGS. 1A and 1B are schematic cross-sectional views of a semiconductor device 100 according to the first embodiment. FIG. 2 is a schematic top view illustrating a relationship between a length of a second semiconductor region in a direction parallel to a first direction and a length of a third semiconductor region in a direction parallel to the first direction, in the semiconductor device according to the first embodiment. A cross-sectional view taken along line IA-IA of FIG. 2 is FIG. 1A. A cross-sectional view taken along line IB-IB of FIG. 2 is FIG. 1B. The semiconductor device 100 according to the first embodiment is a vertical MOSFET of a trench gate type having a super junction structure.

In FIGS. 1A to 2, a first direction is referred to as an X-axis direction, one direction perpendicular to the X-axis direction is referred to as a Y-axis direction (second direction), and a direction perpendicular to the X-axis direction and the Y-axis direction is referred to as a Z-axis direction. A cross section of IA-IA line of FIG. 2 and a cross section of IB-IB line of FIG. 2 are within a plane perpendicular to the Y-axis direction, that is, a plane parallel to an XZ plane. FIGS. 1A and 1B are cross-sectional views within a plane perpendicular to Y-axis direction of the semiconductor device 100, that is, within a plane parallel to the XZ plane. In addition, in other words, FIG. 2 is a schematic top view in a case in which the semiconductor device 100 is viewed from the Z direction.

The semiconductor device 100 includes a first electrode (source electrode) 4, a second electrode (drain electrode) 6, a first semiconductor region 8 of a first conductivity type, a second semiconductor region 10, a sixth semiconductor region 12 of a second conductivity type, a seventh semiconductor region 14, a first insulating region 16, a first empty hole (void) 18, a third electrode (gate electrode) 20, a second insulating region (gate insulating film) 22, an eighth semiconductor region 30 of the second conductivity type, a ninth semiconductor region 32 of the first conductivity type, a tenth semiconductor region 34 of the second conductivity type, a third semiconductor region 40, a fourth semiconductor region 42, a third insulating region 46, a second empty hole (void) 48, a fourth insulating region 50, a barrier metal 52, and an upper surface 70.

Hereinafter, a case in which a first conductivity type is n type and a second conductivity type is p type will be described as an example. In addition, impurity concentration of the first conductivity type is represented in the sequence of an n$^+$ type, an n type, and an n$^-$ type from higher to lower concentration. In the same manner, impurity concentration of a second conductivity type is represented in the sequence of a p$^+$ type, a p$^-$ type, and a p type from higher to lower concentration.

The first electrode 4 is a source electrode of the semiconductor device 100. The first electrode 4 comprises, for example, aluminum (Al).

The second electrode 6 is a drain electrode of the semiconductor device 100. The second electrode 6 comprises, for example, vanadium (V), nickel (Ni), gold (Au), silver (Ag), or tin (Sn).

The first semiconductor region 8 of an n type is provided between the first electrode 4 and the second electrode 6, and has the upper surface 70. The first semiconductor region 8 comprises silicon (Si) including (doped with) n type impurity. The n type impurity is, for example, phosphorus (P) or arsenic (As). The first semiconductor region 8 is a portion of a super junction structure having an n type doping.

The barrier metal 52 is provided between the first electrode 4 and the first semiconductor region 8. The barrier metal 52 prevents aluminum and silicon from inter-diffusing via direct contact between aluminum (Al) for being used for the source electrode 54, which will be described below, and silicon. The barrier metal 52 contains, for example, titanium nitride (TiN), titanium (Ti), or titanium tungsten (TiW).

A plurality of second semiconductor regions 10 are provided in alternation with the first semiconductor region (s) 8 in a first direction. Each second semiconductor region 10 contains p type impurity. The p type impurity is, for example, boron (B). The second semiconductor regions 10 are the portion of a super junction structure having a p type doping.

Each second semiconductor region 10 includes the sixth semiconductor region 12 of a p type and the seventh semiconductor region 14, which is provided inside the sixth semiconductor region 12. The sixth semiconductor region 12 includes, for example, silicon (Si) and p type impurity. The seventh semiconductor region 14 contains, for example, i type (non-doped type) silicon (Si) (intrinsic silicon).

The first insulating region 16 is provided inside the seventh semiconductor region 14 (so also inside the second semiconductor region 10). The first insulating region 16 contains, for example, a silicon oxide (SiO$_2$). The first insulating region 16 includes the first empty hole 18 provided inside the first insulating region 16.

In the first embodiment, the seventh semiconductor region 14 including i type (non-doped type) silicon (Si) is provided inside the sixth semiconductor region 12. For this reason, p type impurity concentration of the second semiconductor region 10 decreases along a direction from the first semiconductor region 8 toward the first insulating region 16. That is, in effect, a region within the second semiconductor region near the first semiconductor region is provided to have a higher p type impurity concentration than a region within the second semiconductor region that is near the first insulating region 16.

The third electrode 20 is provided on/in the first semiconductor region between adjacent second semiconductor regions 10. The third electrode 20 is a gate electrode of the semiconductor device 100. The third electrode 20 contains, for example, polycrystalline silicon (Si).

The second insulating region 22 is provided around the third electrode 20. The second insulating region 22 is a gate insulating film of the semiconductor device 100. The second insulating region 22 includes, for example, a silicon oxide (SiO$_2$).

The eighth semiconductor region 30 of a p type is provided between a second semiconductor region 10 and a third electrode 20. The eighth semiconductor region 30 of a p type is a channel region (base region) of the semiconductor device 100.

The ninth semiconductor region 32 of an n type is provided on the eighth semiconductor region 30 and between a second semiconductor region 10 and a third electrode 20. The ninth semiconductor region 32 of an n type is a source region of the semiconductor device 100.

The tenth semiconductor region 34 of a p$^+$ type is provided on the eighth semiconductor region 30 and between a second semiconductor region 10 and the ninth semiconductor region 32. The tenth semiconductor region 34 of a p$^+$ type is a channel contact region (base contact region) of the semiconductor device 100.

The third semiconductor region 40 is provided in semiconductor device 100 along a second direction perpendicular to the first direction from the second semiconductor region 10. The third semiconductor region 40 includes the fourth semiconductor region 42 of a p type, a third insulating region 46 provided inside the fourth semiconductor region 42, a fourth insulating region 50 provided inside the third insulating region 46, and a second empty hole (void) 48 provided inside the fourth insulating region 50 (so also inside the third insulating region 46). A sidewall-to-sidewall distance $d_2$ in the third semiconductor region 40 along a direction parallel to the first direction is greater than a sidewall-to-sidewall distance $d_1$ in the second semiconductor region 10 along the direction parallel to the first direction.

The third insulating region 46 contains, for example, a silicon oxide (SiO$_2$) formed by a thermal oxide method. The fourth insulating region 50 contains, for example, a silicon oxide (SiO$_2$) formed by a chemical vapor deposition (CVD) method, and is a boron phosphorus silicon glass (BPSG).

The second empty hole 48 is connected to the first empty hole 18 in the second direction—that is, a tube-like structure is formed along the second direction. In addition, the fourth semiconductor region 42 may be connected to the sixth semiconductor region 12 in the second direction.

In the semiconductor device 100 according to the first embodiment, another second semiconductor region 10 is further provided in the first direction spaced from one second semiconductor region 10, as illustrated in FIG. 2. Similarly, another third semiconductor region 40 is further provided spaced in the first direction from one third semiconductor region 40. That is, the structures repeat along the first direction.

Next, a manufacturing method of the semiconductor device 100 according to the first embodiment will be described.

In the manufacturing method of the semiconductor device 100, a first groove 60 is formed in the first semiconductor region 8. The first groove 60 has width $d_1$ in a direction parallel to the first direction and extends lengthwise along the second direction (perpendicular to the first direction). A plurality of first grooves 60 may be formed such that the first grooves 60 alternates with the first semiconductor region 8 in the first direction, a second groove 62, which is connected to the first groove 60 in the second direction (lengthwise direction), has a width $d_2$ in a direction parallel to the first direction. The width is $d_2$ greater than the width $d_1$. The second groove 62 extends lengthwise along the second direction. The first groove 60 and second groove 62 are thus formed to correspond in shape when viewed from the z direction to the semiconductor regions 10 and 40 depicted in FIG. 2. A sixth semiconductor region 12 of a p type is formed on the first groove. A fourth semiconductor region 42 of a p type is formed on the second groove. The formation of sixth semiconductor region 12 and fourth semiconductor region 42 may occur in a same process step. A seventh semiconductor region 14 of an i type is formed on the sixth semiconductor region 12. A first empty hole 18 is formed inside the seventh semiconductor region 14. A fifth semiconductor region 44 of an i type is formed on the fourth semiconductor region 42. A third insulating region 46 is formed by oxidizing the fifth semiconductor region 44. A first insulating region 16 is formed around the first empty hole 18 inside the seventh semiconductor region 14 by oxidizing a portion of the seventh semiconductor region 14. A fourth insulating region 50 is formed inside the third insulating region 46 and a second empty hole 48 is formed in the fourth insulating region 50. An eighth semiconductor region 30 of a p type is formed on the first semiconductor region 8. A ninth semiconductor region 32 of an n type is formed on the first semiconductor region 8. A tenth semiconductor region 34 of a p type is formed on the first semiconductor region 8. A second insulating region 22 is formed on the first semiconductor region 8. A third electrode 20 is formed on the first semiconductor region 8. A barrier metal 52 is formed on the first semiconductor region 8. A source electrode 54 is formed on the first semiconductor region 8. A drain electrode 6 is formed so as to come into contact with a surface of the first semiconductor region 8 opposite the surface on which the source electrode 54 is provided, of the first semiconductor region.

Figure 3A:
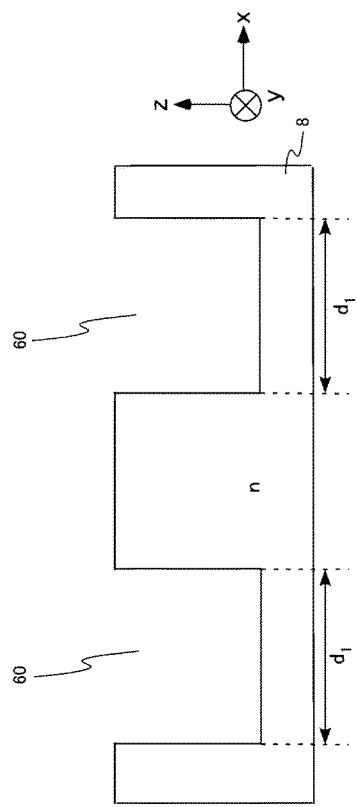
Figure 3B:
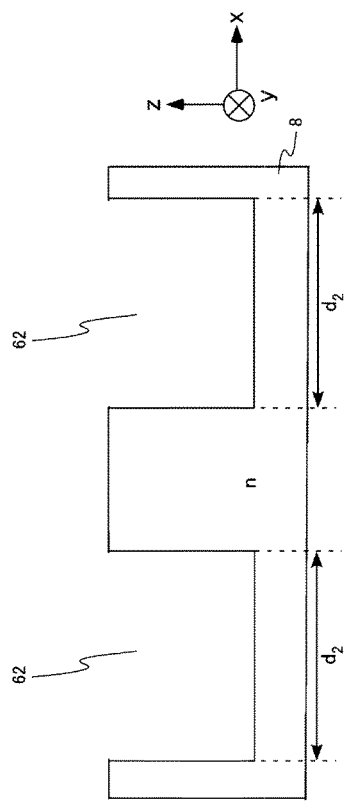

First, as illustrated in FIG. 3A, the first groove 60 whose width in a direction parallel to the first direction is $d_1$ is formed extending (lengthwise) in the second direction perpendicular to the first direction. A plurality of first grooves 60 are formed so as to alternate with the first semiconductor region 8 of an n type in the first direction. As illustrated in FIG. 3B, a second groove 62, which is connected to the first groove 60 and whose width in a direction parallel to the first direction is $d_2$ ($d_2 > d_1$) is formed extending in the second direction.

Subsequently, as illustrated in FIG. 4A, the sixth semiconductor region 12 of a p type is formed on the first groove 60 by an epitaxial growth method. In addition, the fourth semiconductor region 42 of a p type is formed on the second groove 62 by, for example, an epitaxial growth method. The sixth semiconductor region 12 and the fourth semiconductor region 42 may be coupled to each other in the second direction.

Subsequently, as illustrated in FIG. 5A, the seventh semiconductor region 14 of an i type (non-doped type) is formed on the sixth semiconductor region 12. At this time, in a portion which is the first groove 60 illustrated in FIG. 4A, an upper portion of the first groove 60 is closed as illustrated in FIG. 5A, whereby the first empty hole 18 is formed inside the seventh semiconductor region 14.

As illustrated in FIG. 5B, a fifth semiconductor region 44 of an i type (non-doped type) is formed on the fourth semiconductor region 42. Since a width of the second groove 62 is greater than that of the first groove 60, an upper portion of the second groove 62 is not closed at this time unlike the upper portion of the first groove 60.

Subsequently, as illustrated in FIGS. 6A and 6B, for example, oxygen gas is supplied inside the second groove 62, whereby the fifth semiconductor region 44 is oxidized. Accordingly, the third insulating region 46 is formed. In addition, the oxygen gas which is supplied inside the second groove 62 is supplied to the first empty hole 18 from the second groove 62 via the existing connection between the first (61) and second (62) grooves. Hence, a portion of the seventh semiconductor region 14 is oxidized, and thus the first insulating region 16 is formed inside the first empty hole 18 of the seventh semiconductor region 14.

Subsequently, BPSG is introduced into the third insulating region 46 by, for example, the CVD method. Then, the fourth insulating region 50 is formed inside the third insulating region 46 and the second empty hole 48 inside the fourth insulating region 50 is formed. Subsequently, BPSG is heated, and the fourth insulating region 50 reflows inside the third insulating region 46. Any surplus fourth insulating region 50 provided on the first semiconductor region 8 is etched and/or removed by chemical mechanical polishing (CMP). These processes are illustrated in FIGS. 7A and 7B.

The eighth semiconductor region 30 of a p type, the ninth semiconductor region 32 of an n type, and the tenth semiconductor region 34 of a p type are formed on the first semiconductor region 8 by an ion injection method or the like. Next, the second insulating region 22, the third electrode 20, the barrier metal 52, and the first electrode 4 are formed on the first semiconductor region. The second electrode 6 is formed to be in contact with a surface of the first semiconductor region 8 which is opposite to a surface on which the first electrode 4 is provided. Accordingly, the semiconductor device 100 illustrated in FIGS. 1A and 1B is obtained.

Since a leakage current can flow through a p type portion (e.g., the second semiconductor region 10) within the super junction structure, characteristics of a semiconductor device may be not stabilized. In order to reduce the leakage current, an insulator such as an oxide film is provided in some portion of the p type portion of the super junction structure. However, if an insulator is provided on an upper surface 70 of the first semiconductor region 8, a device such as an FET is difficult to form on this insulator, and thus it is difficult to miniaturize a semiconductor device. If just an empty hole is provided in a p type portion (perhaps to increase a manufacturing speed), a leakage current can still flow along an inner wall of the empty hole, and thus the leakage problem is still manifested.

However, in the semiconductor device according to the present disclosure, the first insulating region 16 is provided inside the second semiconductor region 10. In this manner, it is possible to substantially prevent the leakage current from flowing through the second semiconductor region. In addition, since an insulator is not provided on the upper surface 70 of the first semiconductor region, it is possible to miniaturize the semiconductor device.

A structure in which the first empty hole 18 is formed inside the first insulating region 16 is provided, and thus it is possible to fabricate the semiconductor device in a high manufacturing speed, and to prevent the leakage current from flowing through the inner wall of the first empty hole 18 by providing first insulating region 16 thereon.

A structure in which second conductivity type impurity concentration of the second semiconductor region 10 decreases from the first semiconductor region 8 toward the first insulating region 16, or a region with high p type impurity concentration being provided near the first semiconductor region 8 rather than near the first insulating regions 16, is provided. Accordingly, by providing the semiconductor region of an i type (non-doped type), the sixth semiconductor region 12 is prevented from being oxidized, and impurity concentration is easily controlled.

By providing the third semiconductor region 40 separately from the second semiconductor region 10, it is possible to form the semiconductor device such as an FET on the second semiconductor region 10, and to prevent the leakage current from flowing by oxidizing the inner wall of the first empty hole 18.

A width of the third semiconductor region 40 in a direction parallel to the first direction is greater than that of the second semiconductor region 10 in a direction parallel to the first direction, whereby it is possible easily close the upper portion of the second semiconductor region 10 without closing the upper portion of the third semiconductor region 40. As a result, oxygen gas or the like is introduced to the second semiconductor region 10 via connection to the third semiconductor region 40, whereby an inner wall of the first empty hole 18 can be oxidized even after the upper portion of the second semiconductor region has been closed off to form the first empty hole 18.

(Second Embodiment)

A semiconductor device 200 according to the second embodiment is different from the semiconductor device 100 according to the first embodiment in that the semiconductor device 200 includes a vertical MOSFET of a planar gate type (planar-type) having a super junction structure. Here, the substantially similar portions of the first and second embodiments will not be described and description will focus on differences.

FIGS. 8A and 8B are schematic cross-sectional views of the semiconductor device 200 according to the second embodiment. In the semiconductor device 200 and manufacturing method thereof, it is also possible to provide a semiconductor device which can stabilize the characteristics of the super junction structure.

(Third Embodiment)

A semiconductor device 300 according to the third embodiment is different from the semiconductor device 100 according to the first embodiment in that a third semiconductor region 40 is provided in one groove spaced in the first direction from the second semiconductor region 10 of a different groove rather than having second semiconductor regions 10 in adjacent grooves being aligned with each other in the first direction (x direction of FIG. 9).

FIG. 9 is a schematic top view illustrating an aspect of a semiconductor device 300 according to the third embodiment. A relationship between a length of the second semiconductor region in a direction parallel to a first direction and a length of a third semiconductor region in a direction parallel to the first direction in a semiconductor device 300 is depicted. By providing the second third semiconductor regions in this manner, more of the second semiconductor region and the third semiconductor region per unit length along the first direction (X-axis direction) can be provided, whereby it is possible to miniaturize the semiconductor device.

In semiconductor device 300, it is possible to provide a smaller (miniaturized) semiconductor device having improved (stabilized) characteristics of a super junction structure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first semiconductor region between a first electrode and a second electrode and including a first conductivity type material;
    a second semiconductor region including a second conductivity type material and adjacent to the first semiconductor region in a first direction;
    a first insulating region within the second semiconductor region; and
    a third electrode on the first semiconductor region via a second insulating region, wherein
    the second semiconductor region includes a region of intrinsic silicon,
    a first void is within the first insulating region which is within the region of intrinsic silicon,
    the first void has an outer surface of silicon dioxide formed by oxidation of intrinsic silicon, and
    the first insulating region is silicon dioxide formed by the oxidation of the intrinsic silicon.

2. The semiconductor device according to claim 1, wherein an impurity concentration of second conductivity type in the second semiconductor region decreases along a direction from the first semiconductor region towards the first insulating region.

3. The semiconductor device according to claim 2, further comprising:
    a third semiconductor region between the first and second electrodes and adjacent to the first semiconductor region in the first direction and connected to the second semiconductor region in a second direction perpendicular to the first direction;
    a fourth semiconductor region of a second conductivity type within the third semiconductor region;
    a third insulating region within the fourth semiconductor region; and
    a second void within the third insulating region and connected to the first void along the second direction.

4. The semiconductor device according to claim 3, wherein a width of the third semiconductor region along a direction parallel to the first direction is greater than a width of the second semiconductor region along the direction parallel to the first direction.

5. The semiconductor device according to claim 3, further comprising:
    a fourth insulating region within the third insulating region which forms a surface of the second void, wherein the third and fourth insulating regions comprise different materials.

6. The semiconductor device according to claim 1, wherein the first insulating region comprises intrinsic silicon.

7. The semiconductor device according to claim 1, further comprising:
a third semiconductor region between the first and second electrodes and adjacent to the first semiconductor region in the first direction and connected to the second semiconductor region in a second direction perpendicular to the first direction;
a fourth semiconductor region of a second conductivity type within the third semiconductor region; and
a third insulating region within the fourth semiconductor region.

8. The semiconductor device according to claim 7, further comprising:
a second void within the third insulating region and connected to the first void along the second direction.

9. The semiconductor device according to claim 1, wherein the third electrode is a trench-type electrode.

10. The semiconductor device according to claim 1, wherein the third electrode is a planar-type electrode.

11. A semiconductor device, comprising:
a super junction structure including first regions of a first conductivity type and second regions of a second conductivity type that is opposite to the first conductivity type, the first and second regions alternating with each other along a first direction, wherein
at least one second region includes an insulating material within a semiconductor material of the second conductivity type such that a concentration of second conductivity type impurities in the at least one second region decreases along a direction from an interface with one of the first regions towards a central portion of the at least one second region, wherein
the at least one second region includes a region of intrinsic silicon,
a first void is within a first insulating region which is within the region of intrinsic silicon,
the first void has an outer surface of silicon dioxide formed by oxidation of intrinsic silicon, and
the first insulating region is silicon dioxide formed by the oxidation of the intrinsic silicon.

12. The semiconductor device according to claim 11, wherein the first void is also within a second insulating region which is formed on the first region.

13. The semiconductor device according to claim 12, wherein an intrinsic silicon material is between the semiconductor material and the first void.

14. The semiconductor device according to claim 11, wherein widths of the first and second regions in the first direction vary along a second direction perpendicular to the first direction.

* * * * *